United States Patent [19]

Shin

[11] Patent Number: 4,777,391

[45] Date of Patent: Oct. 11, 1988

[54] BIPOLAR MULTIPLEXER HAVING A SELECT BUFFER CIRCUIT WITH A CHARGING AND DISCHARGING CIRCUIT

[75] Inventor: Yong-In Shin, Orem, Utah

[73] Assignee: Signetics Corporation, Sunnyvale, Calif.

[21] Appl. No.: 75,492

[22] Filed: Jul. 17, 1987

[51] Int. Cl.$^4$ .................. H03K 19/013; H03K 19/088
[52] U.S. Cl. .................. 307/456; 307/263; 307/443; 307/463; 307/542
[58] Field of Search .............. 307/456, 475, 463, 300, 307/280, 270, 254, 443, 555, 263, 542

[56] References Cited

U.S. PATENT DOCUMENTS

| | | | |
|---|---|---|---|
| Re. 27,804 | 10/1973 | Treadway | 307/456 |
| 4,131,808 | 12/1978 | Kuo | 307/270 |
| 4,132,906 | 1/1979 | Allen | 307/254 |
| 4,321,490 | 3/1982 | Bechdolt | 307/456 |

FOREIGN PATENT DOCUMENTS 58-19032 2/1983 Japan .

Primary Examiner—Stanley D. Miller
Assistant Examiner—Timothy P. Callahan
Attorney, Agent, or Firm—Algy Tamoshunas; Steven R. Biren

[57] ABSTRACT

A select buffer circuit includes a first inverter circuit, a second inverter circuit connected to the first, and a circuit for charging and discharging the base of an inverter transistor in the second inverter circuit from a node in the first inverter circuit. The charging and discharging circuit includes a Schottky diode connected to the inverter transistor, a Schottky transistor connected in series with the diode, and a resistor for coupling the base of the Schottky transistor to the node in the first inverter circuit. A bipolar multiplexer including the select buffer circuit offers the advantage of an improved output waveform.

4 Claims, 2 Drawing Sheets

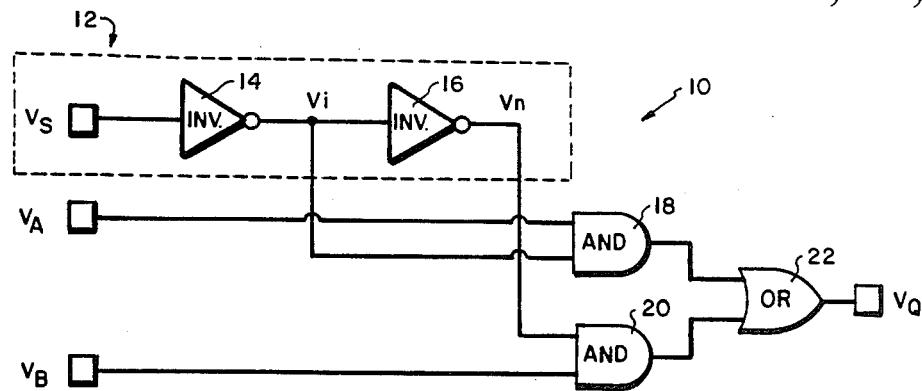
FIG.1
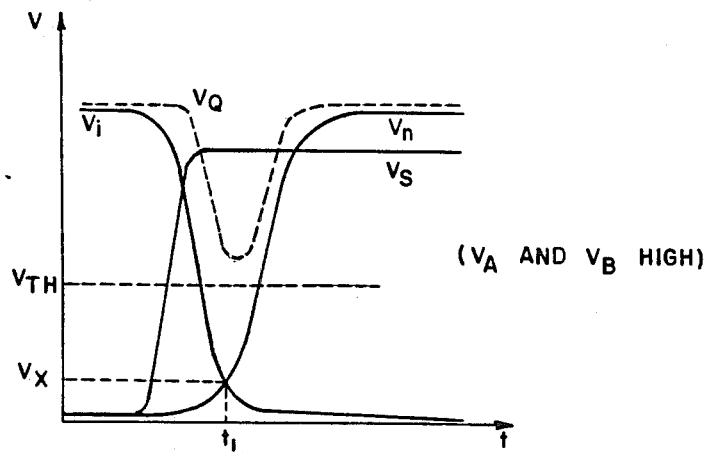
FIG.2
FIG.3
PRIOR ART (V_A AND V_B HIGH)

BIPOLAR MULTIPLEXER HAVING A SELECT BUFFER CIRCUIT WITH A CHARGING AND DISCHARGING CIRCUIT

BACKGROUND OF THE INVENTION

This invention relates to bipolar multiplexers, and more specifically to an improved select buffer circuit for use in combination with such bipolar multiplexers.

Various types of improved logic gate and buffer circuits, including several having means for discharging an output transistor, are shown in the prior art. Some typical examples of such circuits are shown in U.S. Pat. Nos. 4,321,490; 4,132,906; 4,131,808; RE. 27804; and Japanese Patent Publication No. 58-19032. In U.S. Pat. No. 4,703,202, a problem similar to that addressed by the present invention is solved in a different manner.

While the prior art is directed to various ways of generally improving the performance of logic gate and buffer circuits, it does not recognize or address the particular problem solved by the present invention. This problem, which is described in further detail below, concerns the presence of a so-called "output glitch", an unwanted transitory shift in output signal level at a time when the output voltage level should remain substantially constant. This "output glitch", which is caused by a timing delay within the select buffer circuit of the bipolar multiplexer, constitutes a substantial performance drawback in conventional bipolar TTL multiplexers.

Accordingly, it would be desirable to have a select buffer circuit suitable for use in bipolar multiplexers which is capable of eliminating the multiplexer "output glitch". Ideally, such an improved select buffer circuit would not deteriorate the switching performance or increase the power consumption of the bipolar multiplexer. Additionally, the improved circuit should be relatively simple and easy to implement.

SUMMARY OF THE INVENTION

It is accordingly an object of the invention to provide a select buffer circuit for use in combination with a bipolar multiplexer which is capable of eliminating the "output glitch" present in prior-art multiplexers.

It is a further object of the invention to provide a select buffer circuit which accomplishes the aforementioned object without degrading circuit performance or increasing power consumption, and which is relatively simple and easy to manufacture.

In accordance with the invention, these objects are achieved by a new select buffer circuit, suitable for use in a bipolar multiplexer, which includes a first inverter circuit, a second inverter circuit connected to the first, and a circuit for charging and discharging the base of an inverter transistor in the second inverter circuit from a node in the first inverter ciruit. This charging and discharging circuit, which provides the improved performance of the invention, includes a Schottky diode connected to the base of the inverter transistor, a Schottky transistor connected in series with the diode, and a resistor which connects the base of the Schottky transistor to the node in the first inverter circuit. The charging and discharging circuit operates by coupling a signal from the node of the first inverter circuit to the base of the Schottky transistor, which transistor is coupled to the inverter transistor in the second inverter circuit. In this manner the charging and discharging of the base of the inverter transistor is suitably controlled to prevent the "output glitch" in a bipolar multiplexer using the improved select buffer circutt.

The invention may be more completely understood with reference to the following detailed description, to be read in conjunction with the accompanying drawing.

BRIEF DESCRIPTION OF THE DRAWING

FIG. 1 is a block diagram of a bipolar multiplexer having a select buffer circuit;

FIG. 2 is a "truth table" showing the various logical states of the bipolar multiplexer of FIG. 1;

FIG. 3 is a multiple-waveform diagram showing selected waveforms of a prior-art bipolar multiplexer;

DESCRIPTION OF THE PREFERRED EMBODIMENT

Figure 4:
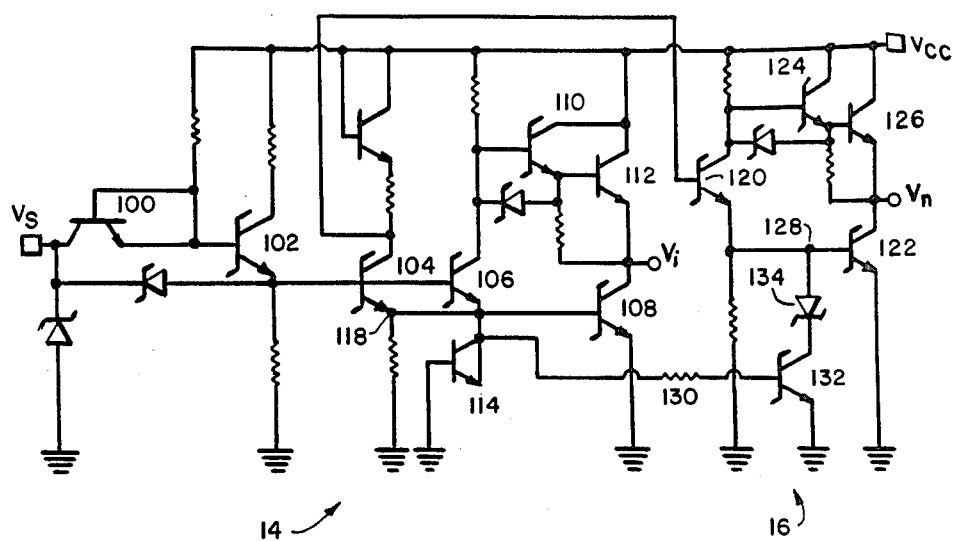
FIG. 4 is a schematic diagram of a select buffer circuit in accordance with the invention and suitable for use in a bipolar multiplexer.

A bipolar multiplexer 10 including a select buffer circuit 12 is shown in block diagram form in FIG. 1. The multiplexer receives input signals $V_A$ and $V_B$, and select input $V_S$, and provides an output signal $V_Q$. The select buffer circuit 12 of the multiplexer, shown within the dashed-line box in FIG. 1, includes a first inverter circuit 14 having an input connected to the select input and providing an inverting output $V_i$. The inverting output of inverter 14 is connected to the input of a second inverter circuit 16, which provides an output $V_n$ which is noninverted with respect to the select input signal $V_S$. A first AND gate 18 has a first input connected to the inverting output of first inverter circuit 14 and a second input connected to $V_A$. A second AND gate 20 has a first input connected to the output of second inverter circuit 16 and a second input connected to $V_B$. The outputs of AND gates 18 and 20 provide the inputs to an OR gate 22, and the multiplexer output $V_Q$ is provided at the output of OR gate 22. The select buffer circuit portion of the block diagram, within the dashed box, will be described in further detail below.

A "truth table" showing the state of multiplexer output $V_Q$ as a function of $V_A$, $V_B$ and $V_S$ is shown in FIG. 2. From this "truth table", it can be seen that the output $V_Q$ corresponds either to input $V_A$ or input $V_B$, depending upon the state of select input signal $V_S$. It can also be seen from FIG. 2 that when $V_A$ and $V_B$ are both high, multiplexer output $V_Q$ should remain high regardless of the state of select input signal $V_S$.

However, in conventional bipolar TTL multiplexers, this is not always the case, as an "output glitch" typically occurs at about the time when select input $V_S$ goes from low to high. The nature of this "output glitch" problem may be better understood with reference to the waveform diagram of FIG. 3. This figure shows the select input signal $V_S$, multiplexer output $V_Q$ and the intermediate signals $V_i$ and $V_n$ generated by a prior-art buffer circuit not in accordance with the present invention. As can be seen in FIG. 3, when the select input signal $V_S$ goes from low to high, the first inverter circuit output $V_i$ goes from high to low at substantially the same time. However, the second inverter circuit 16 switches from low to high with a delay, caused by the inherent switching delay in inverter circuit 16 and the fact that this inverter circuit does not begin to switch until after the first inverter circuit output has reached a switching threshold voltage $V_{TH}$, typically $2V_{be}$. As a result, there is a period of time, around time $t_1$ in FIG. 3, during which both $V_i$ and $V_n$ are below the threshold voltage $V_{TH}$. At time $t_1$, both $V_i$ and $V_n$ are at a voltage $V_X$, which is substantially lower than $V_{TH}$.

As a result of this phenomenon, during the period of time around $t_1$, one input to both AND gate 18 and AND gate 20 will be low, so that there will be a momentary "zero" output from both of these AND gates around time $t_1$ even when both $V_A$ a $V_B$ are high. When both AND gate outputs drop low, the output of OR gate 22, which is multiplexer output $V_Q$, will momentarily drop low, even when both $V_A$ and $V_B$ are high. This momentary voltage drop or "output glitch" is shown by the dashed line $V_Q$ in FIG. 3 and constitutes a substantial detriment in prior-art multiplexers. It should be noted that no similar problem occurs when $V_A$ and $V_B$ are both low, as one input to each of AND gates 18 and 20 is then low, so that both AND gate outputs will remain low regardless of the state of $V_i$ and $V_n$.

An improves select buffer circuit 12, which overcomes the "output glitch" problem described above, is shown in FIG. 4. The select buffer circuit 12 includes a first inverter circuit 14 having a select input terminal $V_S$ and an inverting output terminal $V_i$, and a second inverter circuit 16 having its input connected to a node of the first inverter circuit in phase with $V_i$, and a noninverting output terminal $V_n$. The select buffer circuit is powered by a voltage supply line, connected in operation to a voltage source at terminal $V_{CC}$.

The first inverter circuit 14 includes an input transistor 100 connected as a diode for coupling the select input terminal $V_S$ to a level-shifting transistor 102 in order to provide an input threshold voltage $V_{TH}$ equal to two base-emitter voltage drops. The signal at the emitter of transistor 102 is connected to the bases of first and second phase-splitter transistors 104 and 106. The emitters of transistors 104 and 106 are connected together and also to the base of an inverter transistor 108. The collector of transistor 106 is connected through transistors 110 and 112, in a Darlington configuration, to the collector of inverter transistor 108. A transistor 114 is connected as a reverse-biased diode and acts as a capacitance between the base of transistor 108 and ground. The inverting output of the first inverter circuit is taken from the collector of transistor 108, at the terminal $V_i$ in FIG. 4, while the emitter of this transistor is connected to ground.

The second inverter circuit 16 includes a third phase-splitter transistor 120, with the input of the second inverter circuit at the base of transistor 120 being connected to the collector of the first phase-splitter transistor 104, so that the second inverter circuit receives an "upstream" input signal in phase with the output of first inverter circuit 14. The emitter of transistor 120 is connected to the base of a second inverter transistor 122, while the emitter of inverter transistor 122 is connected to ground and its collector is connected to noninverting output terminal $V_n$. Additionally, the collector of phase-splitter, transistor 120 is coupled to the collector of inverter transistor 122 by transistors 124 and 126, connected in a Darlington configuration.

The "output glitch" problem associated with prior-art multiplexers using select buffer circuits is substantially eliminated in the present invention by a circuit which couples a signal from node 118, at the base of transistor 108 in the first inverter circuit, to a node 128 at the base of inverter transistor 122 in the second inverter circuit. This coupling circuit includes a resistor 130 having one end connected to node 118 and a second end connected to the base of a Schottky discharging transistor 132. The size of resistor 130 is selected as a function of the size of transistors 108, 122 and 132, as well as the speed of base discharging desired. Typically, resistor 130 will have a value of between about 30 ohms and 100 ohms, with a preferred value of about 60 ohms. The emitter of transistor 132 is connected to ground, and a Schottky diode 134 has its anode connected to node 128 and its cathode connected to the collector of transistor 132. The remaining components of the circuit shown in FIG. 4 include conventional components such as pull-up resistors, input diodes and the like, and are accordingly not described in further detail.

The manner in which the circuit composed of resistor 130, transistor 132 and diode 134 serves to substantially eliminate the "output glitch" problem will be explained in connection with FIG. 5, which is a waveform diagram which depicts the waveforms of FIG. 3, but shown here for the improved circuit of FIG. 4 rather than for the prior art. There are several important differences between the waveforms shown in FIG. 5 and FIG. 3. First, the inverting output waveform $V_i$ has a somewhat slower fall time than the corresponding waveform in FIG. 3. This is because a portion of the base current that would ordinarily serve to turn on transistor 108 is now diverted through resistor 130 to transistor 132 in the second inverter circuit. As a result of this, the base drive current to transistor 108 is reduced, thus turning on transistor 108 more slowly and causing the voltage $V_i$ to drop more slowly.

Figure 5:
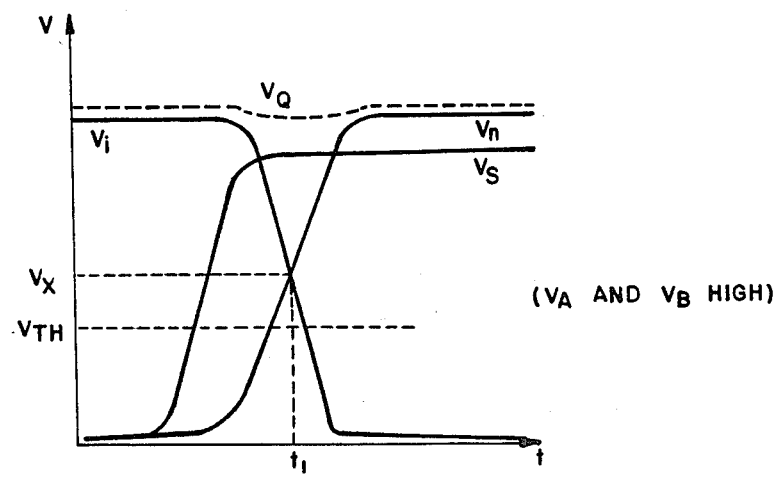
FIG. 5 is a multiple-waveform diagram showing various waveforms of a bipolar multiplexer using a select buffer circuit in accordance with the invention.

The second important difference between FIG. 5 and FIG. 3 is that the noninverting voltage waveform $V_n$ rises substantially sooner in FIG. 5 than in FIG. 3. This is because the previously-mentioned current flowing through resistor 130 serves to turn on transistor 132 at substantially the same time as transistor 10 of the first inverter circuit is being turned on, thus creating a conductive path between node 128, through diode 134 and transistor 132, to ground. This conductive path serves to drain off stored charge from node 128, thus enabling inverter transistor 122 to turn off more rapidly and permitting the voltage $V_n$ at the collector of transistor 122 to rise sooner. Additionally, because transistor 120 receives its input from the collector of transistor 104, which switches before transistor 108, transistor 120 will be switched off sooner than it would have been if the base of transistor 120 would have been connected directly to the inverting output $V_i$. Thus, the base drive to transistor 122 is more rapidly removed when transistor 120 is turned off, and, most importantly, any remaining stored charge at node 128 is rapidly discharged to ground by diode 134 and transistor 132.

As a result of these circuit improvements, the waveform $V_n$ in FIG. 5 rises substantially sooner, and the waveforms $V_i$ and $V_n$ now intersect at a voltage $V_X$ which is higher than $V_{TH}$. Thus, in contrast to FIG. 3, there is no point in time at which both $V_i$ and $V_n$ are below $V_{TH}$. Because of this, the problem previously described, in which one input to both AND gates 18 and 20 in FIG. 1 is low, thus resulting in an "output glitch", is substantially eliminated. Accordingly, the voltage $V_Q$ at the multiplexer output terminal is shown as a substantially flat waveform in FIG. 5, as compared to the significant dip shown in the comparable waveform in FIG. 3.

A further advantage of the present invention is that the substantial improvement in performance noted above is achieved with substantially no AC or DC operational penalty.

While the invention has been particularly shown and described with reference to a preferred embodiment, it will be understood by those skilled in the art that various changes in form and detail, such as the use of PNP transistors in place of NPN transistors, may be made without departing from the spirit and scope of the invention.

I claim:

1. A select buffer circuit for use in a bipolar multiplexer, which comprises:

a first inverter circuit having a select input terminal, first and second bipolar phase-splitter transistors, a first bipolar inverter transistor, and an inverting output terminal, the bases of said first and second phase-splitter transistors being connected together and coupled to said select input terminal, the emitters of said first and second phase-splitter transistors being connected together, the collector of said second phase-splitter transistor being coupled to said inverting output terminal, the base of said first inverter transistor being connected to the emitters of said first and second phase-splitter transistors, the collector of said first inverter transistor being connected to said inverting output terminal, and the emitter of said first inverter transistor being connected to ground;

a second inverter circuit having an input, a third bipolar phase-splitter transistor, and a noninverting output terminal, the input of said second inverter circuit being connected to the collector of said first phase-splitter transistor and the base of said third phase-splitter transistor, and a second bipolar inverter transistor, the base of said second inverter transistor being connected to the emitter of said third phase-splitter transistor, the collector of said second inverter transistor being connected to said noninverting output terminal and the emitter of said second inverter transistor being connected to ground;

a voltage supply line, the collectors of said first, second and third phase-splitter transistors and said first and second inverter transistors being coupled to said supply line; and circuit means for controlling the charging and discharging of the base of said second inverter transistor and comprising a Schottky diode having its anode connected to the base of said second inverter transistor, a Schottky discharging transistor having its collector connected to the cathode of said diode and its emitter connected to ground, and a resistor, said resistor being connected between the base of said discharging transistor and the emitters of said first and second phase-splitter transistors.

2. A select buffer circuit as in claim 1, wherein said resistor has a value of between about 30 ohms and 100 ohms.

3. A select buffer circuit as in claim 2, wherein said resistor has a value of about 60 ohms.

4. A bipolar multiplexer comprising a select buffer circuit as in claim 1, 2 or 3, further comprising a first AND gate having a first input connected to the inverting output terminal of said first inverter circuit, a second input connected to a first multiplexer input terminal, and an output;

a second AND gate having a first input connected to the noninverting output terminal of said second inverter circuit, a second input connected to a second multiplexer input terminal, and an output; and an OR gate having a first input connected to said first AND gate output, a second input connected to said second AND gate output, and a multiplexer output terminal.

* * * * *